(12) United States Patent
Koh

(10) Patent No.: US 6,884,680 B2
(45) Date of Patent: Apr. 26, 2005

(54) METHOD FOR MANUFACTURING NON-VOLATILE MEMORY DEVICES

(75) Inventor: Kwan Ju Koh, Bucheon-si (KR)

(73) Assignee: ANAM Semiconductor, Inc., Seoul (KR)

(*) Notice: Subject to any disclaimer, the term of this patent is extended or adjusted under 35 U.S.C. 154(b) by 0 days.

(21) Appl. No.: 10/761,212

(22) Filed: Jan. 22, 2004

(65) Prior Publication Data

US 2004/0152252 A1 Aug. 5, 2004

(30) Foreign Application Priority Data

Feb. 4, 2003 (KR) .................................. 10-2003-0006824

(51) Int. Cl.⁷ ............................................. H01L 21/336
(52) U.S. Cl. ..................... 438/257; 438/263; 438/296
(58) Field of Search ................................ 438/257, 259, 438/260, 263, 270, 294, 296

(56) References Cited

U.S. PATENT DOCUMENTS 6,825,523 B1 * 11/2004 Caprara et al. ............. 257/314

* cited by examiner

Primary Examiner—Phuc T. Dang
(74) Attorney, Agent, or Firm—Finnegan, Henderson, Farabow, Garrett & Dunner, L.L.P.

(57) ABSTRACT

A manufacturing method for a non-volatile memory device includes the steps of forming a well and a channel in a silicon substrate, depositing a tunnel oxide layer, a first polysilicon layer and a nitride layer sequentially, and then performing a trench etching thereof to thereby form a self-align flash memory device.

6 Claims, 3 Drawing Sheets

METHOD FOR MANUFACTURING NON-VOLATILE MEMORY DEVICES

FIELD OF THE INVENTION

The present invention relates to a method for manufacturing non-volatile memory devices; and, more particularly, to a method for manufacturing flash memory devices among the non-volatile memory devices.

BACKGROUND OF THE INVENTION

Generally, a semiconductor memory device is classified into a volatile memory device and a non-volatile memory device. The most volatile memory device is a dynamic random access memory (DRAM) and a static random access memory (SRAM), which is characterized in that it requires a steady flow of electricity to maintain its contents. As soon as the power is turned off, whatever data was therein is lost. Meanwhile, the non-volatile memory device almost composed of a read only memory (ROM) can hold its contents whenever power is not supplied.

At present, the non-volatile memory device is classified into a floating gate type and a metal insulator semiconductor type, accumulated with 2 dielectric layers or 3 dielectric layers, in aspect of a manufacturing process.

The floating gate type memory device implements a data holding using a potential well, and is represented by an erasable programmable read only memory (EPROM) tunnel oxide (ETOX) structure which is widely used in electrically EPROM (EEPROM).

In the meanwhile, MIS type stores data using a trap existed in a dielectric bulk, a dielectric-dielectric interface, and a dielectric-semiconductor interface. A metal/silicon oxide-nitride-oxide structure is a representative structure used in a flash EEPROM.

As a technology gets advanced, a system on chip (SOC) technique gets highlighted. Herein, the SOC technique means that various functions, such as Logics, Sonos, and Flasys are operable in single chip. However, these functions require a complex processing for implementing thereof.

SUMMARY OF THE INVENTION

It is, therefore, an object of the present invention to provide a method for manufacturing a non-volatile memory device that is appropriate to form a self-align flash memory.

In accordance with a preferred embodiment of the present invention, there is provided a method for manufacturing a non-volatile memory device, comprising the steps of: (a) forming an oxide layer on a substrate; (b) implanting ions through the oxide layer to sequentially form a well in the substrate and a channel in the well; (c) removing the oxide layer; (d) depositing a tunnel oxide layer, a first polysilicon layer, and a nitride layer sequentially on the substrate; (e) etching the nitride layer, the first polysilicon layer, the tunnel oxide layer and the substrate based on a shallow trench isolation pattern, resulting in a shallow trench in which the substrate is etched by a predetermined depth; (f) filling the shallow trench with an isolation material; (g) performing a polishing until the nitride layer is exposed to form a shallow trench isolation; (h) removing the nitride layer to thereby protrude the shallow trench isolation; and (i) depositing an oxide-nitride-oxide layer and a second polysilicon layer sequentially.

BRIEF DESCRIPTION OF THE DRAWINGS

The above and other objects and features of the present invention will become apparent from the following description of preferred embodiment given in conjunction with the accompanying drawings, in which.

DETAILED DESCRIPTION OF THE PREFERRED EMBODIMENTS

The preferred embodiment of the present invention will now be described in detail with reference to the accompanying drawings.

FIGS. 1A to 1G show a procedure for manufacturing a non-volatile memory device in accordance with the present invention.

Figure 1A:
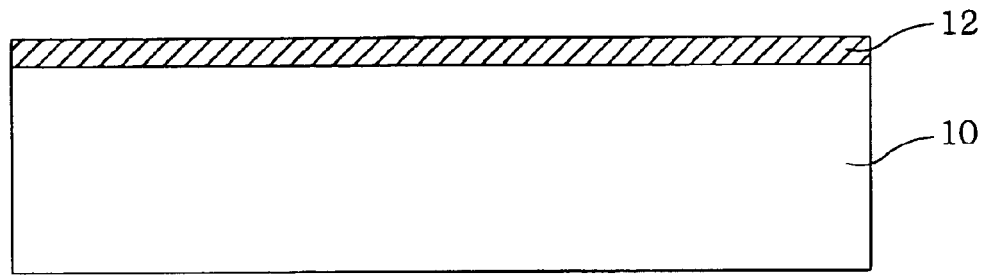
FIGS. 1A to 1G illustrate a procedure for manufacturing a non-volatile memory device in accordance with the present invention.

Referring to FIG. 1A, an oxide layer 12 is deposited on a whole surface of a silicon substrate 10.

Figure 1B:
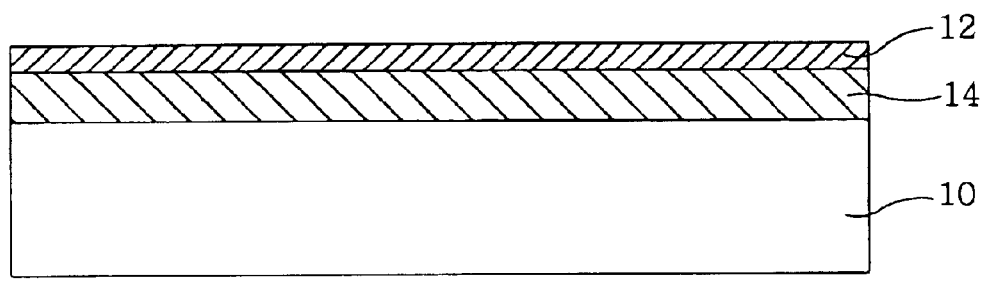

Referring to FIG. 1B, ion implantations are performed into the surface of the silicon substrate 10, to thereby form a well 14 in an upper portion of the substrate 10 and a channel at a surface of the substrate 10 over the well 14. Herein, boron and phosphor are implanted for the well implantation and the channel implantation.

Figure 1C:
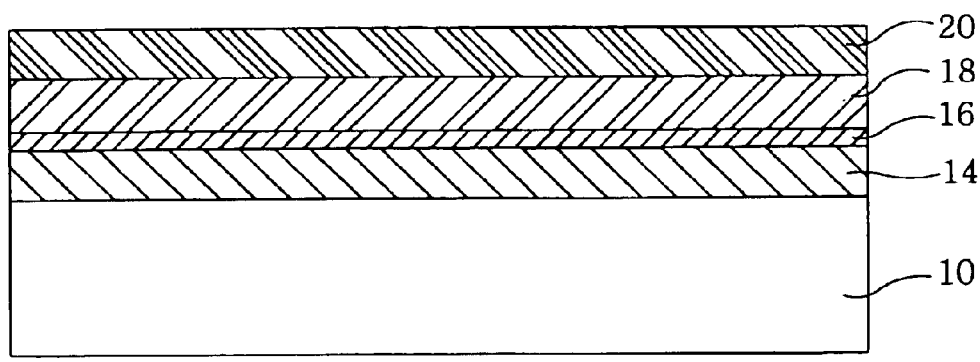

Referring to FIG. 1C, the oxide layer 12 is removed by a wet etch. And then, a tunnel oxide layer 16, a first polysilicon layer 18, and a nitride layer 20 are deposited sequentially.

Figure 1D:
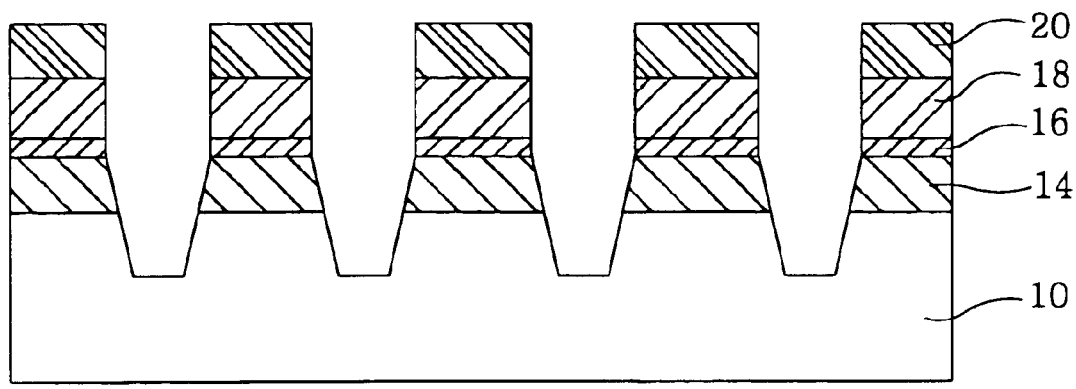

Referring to FIG. 1D, based on a shallow trench isolation suitable to a specific critical dimension, an etching is performed from the nitride layer 20 to the substrate 10, resulting in a shallow trench in which the substrate 10 is etched by a predetermined depth.

Figure 1E:
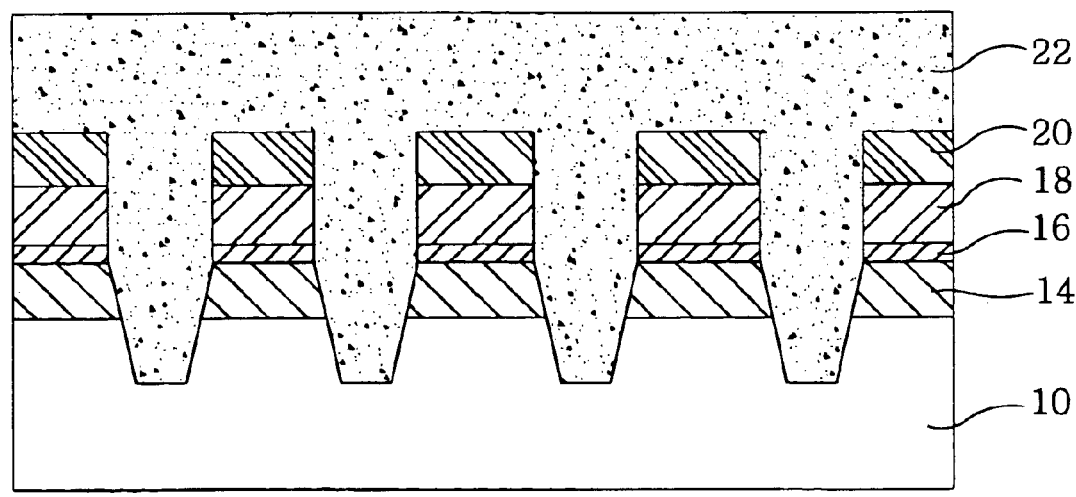

Referring to FIG. 1E, the shallow trench is filled with an isolation material, e.g., a tetra ethyl ortho silicate (TEOS) 22.

Figure 1F:
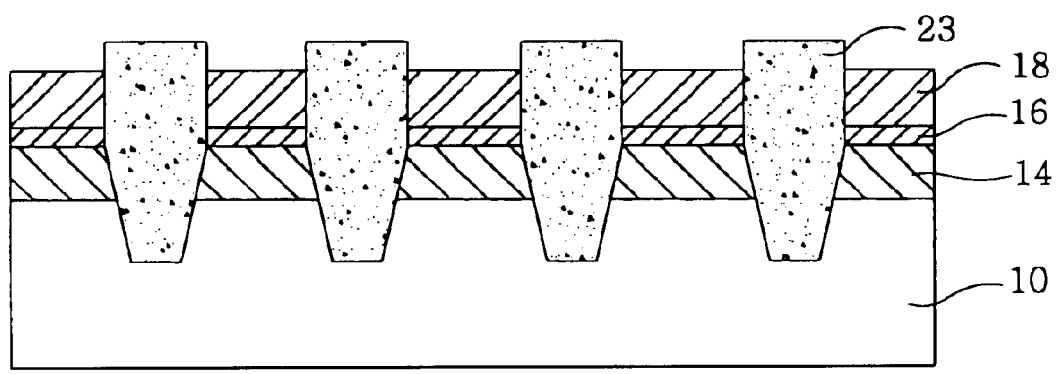

Referring to FIG. 1F, a chemical mechanical polishing is performed until the nitride layer 20 is exposed. In the results, the shallow trench is filled with the isolation material so that a shallow trench isolation 23 is formed. Thereafter, the nitride layer 20 is removed by a wet etch to protrude a part of the shallow trench isolation 23.

Figure 1G:
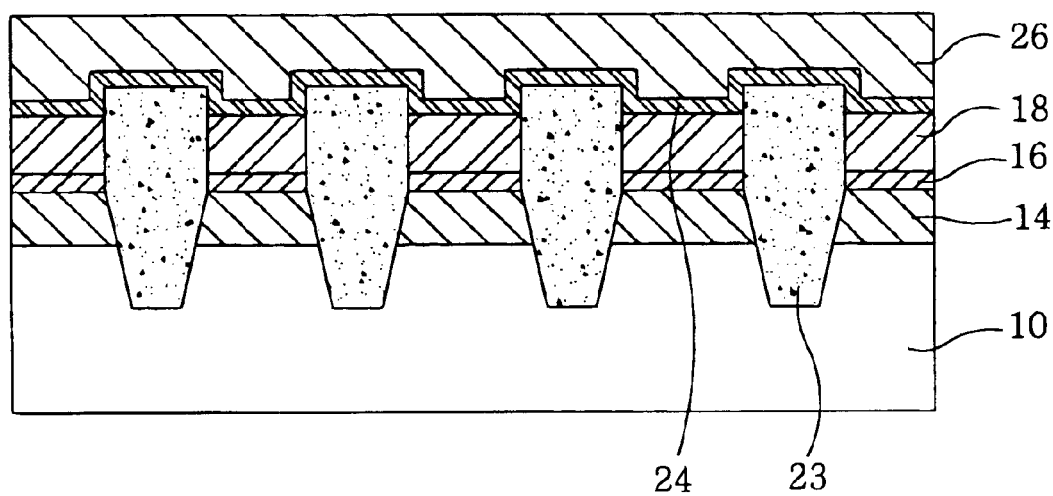

Referring to FIG. 1G, an oxide-nitride-oxide layer 24 is deposited on a structure obtained in the previous step and then a second polysilicon layer 26 is deposited thereon to thereby complete the non-volatile memory device.

In accordance with the present invention, a non-volatile memory device is manufactured through the steps of forming a well and a channel in a silicon substrate, depositing a tunnel oxide layer, a first polysilicon layer and a nitride layer sequentially, and performing a trench etching thereof.

While the invention has been shown and described with respect to the preferred embodiments, it will be understood by those skilled in the art that various changes and modifications may be made without departing from the spirit and scope of the invention as defined in the following claims.

What is claimed is:

1. A method for manufacturing a non-volatile memory device, comprising the steps of:

(a) forming an oxide layer on a substrate;

(b) implanting ions through the oxide layer to sequentially form a well in the substrate and a channel in the well;

(c) removing the oxide layer;

(d) depositing a tunnel oxide layer, a first polysilicon layer, and a nitride layer sequentially on the substrate;

(e) etching the nitride layer, the first polysilicon layer, the tunnel oxide layer and the substrate based on a shallow trench isolation pattern, resulting in a shallow trench in which the substrate is etched by a predetermined depth;

(f) filling the shallow trench with an isolation material;

(g) performing a polishing until the nitride layer is exposed to form a shallow trench isolation;

(h) removing the nitride layer to thereby protrude the shallow trench isolation; and (i) depositing an oxide-nitride-oxide layer and a second polysilicon layer sequentially.

2. The method of claim 1, wherein the substrate is a silicon substrate.

3. The method of claim 1, wherein boron (B) and phosphor (P) are implanted for forming the well and the channel in the step (b).

4. The method of claim 1, wherein the oxide layer is removed by a wet etch in the step (c).

5. The method of claim 1, wherein the polishing is performed by a chemical mechanical polishing in the step (g).

6. The method of claim 1, wherein the nitride layer is removed by a wet etch in the step (h).

* * * * *